(12) United States Patent
Ebihara et al.

(10) Patent No.: US 10,485,093 B2
(45) Date of Patent: Nov. 19, 2019

(54) FLEXIBLE PRINTED BOARD AND METHOD FOR MANUFACTURING FLEXIBLE PRINTED BOARD

(71) Applicant: NIPPON MEKTRON, LTD., Tokyo (JP)

(72) Inventors: Satoshi Ebihara, Tokyo (JP); Takahisa Kato, Tokyo (JP); Nobuto Sasaki, Tokyo (JP); Kazuyuki Azuma, Tokyo (JP); Tomohiro Shimokawaji, Tokyo (JP); Takeo Wakabayashi, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 16/307,111

(22) PCT Filed: Jun. 21, 2017

(86) PCT No.: PCT/JP2017/022890
§ 371 (c)(1),
(2) Date: Dec. 4, 2018

(87) PCT Pub. No.: WO2018/047434
PCT Pub. Date: Mar. 15, 2018

(65) Prior Publication Data
US 2019/0090345 A1 Mar. 21, 2019

(30) Foreign Application Priority Data
Sep. 6, 2016 (JP) .................................. 2016-173856

(51) Int. Cl.
*H05K 1/02* (2006.01)
*H05K 1/18* (2006.01)
*H05K 3/46* (2006.01)

(52) U.S. Cl.
CPC ........... *H05K 1/0209* (2013.01); *H05K 1/181* (2013.01); *H05K 1/189* (2013.01); *H05K 3/4652* (2013.01); *H05K 2201/10106* (2013.01)

(58) Field of Classification Search
CPC ...... H05K 1/0209; H05K 1/181; H05K 1/189; H05K 3/4652; H05K 2201/10106
(Continued)

(56) References Cited

U.S. PATENT DOCUMENTS 9,516,741 B2   12/2016   Hirotsuru et al.
2007/0216013 A1*  9/2007  Funakoshi .......... H01L 23/3735
                                                   257/691

(Continued)

FOREIGN PATENT DOCUMENTS

JP     S59-003567 U     1/1984
JP     S61-192473 U    11/1986
(Continued)

OTHER PUBLICATIONS

International Search Report issued in PCT/JP2017/022890; dated Sep. 5, 2017.
(Continued)

*Primary Examiner* — Tremesha S Willis
(74) *Attorney, Agent, or Firm* — Studebaker & Brackett PC (57) ABSTRACT

Provided are both a flexible printed board, in which heat dissipation performance can be improved in without using an aluminum heal dissipating material, which is light in weight, has good processability and can be reduced in cost, and a method for manufacturing such a flexible printed board. The flexible printed board is a flexible printed board 10 on which a power consuming load is mounted, including: a front surface heat dissipation layer 30 made of a copper foil and having a circuit portion on which the load is mounted; a thermally conductive resin layer 20 having the front surface heat dissipation layer 30 laminated to a front surface side thereof and having a thermal conductivity of 0.49 W/mK or more; and a rear surface heat dissipation layer (Continued)

made of a copper foil, laminated to a rear surface side of the thermally conductive resin layer 20, and having a thickness of 100 to 400% with respect to the front surface heat dissipation layer 30.

12 Claims, 5 Drawing Sheets

(58) Field of Classification Search
 USPC .................................................. 174/252
 See application file for complete search history.

(56) References Cited

U.S. PATENT DOCUMENTS

| | | |
|---|---|---|
| 2009/0032295 A1 | 2/2009 | Okajima et al. |
| 2013/0092421 A1 | 4/2013 | Kajiya |
| 2016/0227644 A1 | 8/2016 | Hirotsuru et al. |

FOREIGN PATENT DOCUMENTS

| | | |
|---|---|---|
| JP | 2005-039110 A | 2/2005 |
| JP | 2005-276943 A | 10/2005 |
| JP | 2007-266204 A | 10/2007 |
| JP | 2010-189614 A | 9/2010 |
| JP | 2011-012193 A | 1/2011 |
| JP | 2011-249574 A | 12/2011 |
| TW | 200536445 A | 11/2005 |
| TW | M410427 U1 | 8/2011 |
| TW | 201526724 A | 7/2015 |
| WO | 2005/101929 A1 | 10/2005 |

OTHER PUBLICATIONS

Taiwanese Office Action dated Jan. 18, 2018 for the corresponding Taiwanese Patent Application No. 106127951.

* cited by examiner

FLEXIBLE PRINTED BOARD AND METHOD FOR MANUFACTURING FLEXIBLE PRINTED BOARD

TECHNICAL FIELD

The present invention relates to a flexible printed board and a method for manufacturing the flexible printed board.

BACKGROUND ART

In recent years, LEDs are often used for automotive lighting. The flexible printed board is often used as a printed board for lighting using the LED. The LED is mounted on the flexible printed board. Therefore, the LED cannot be replaced. Therefore, improvement of heat dissipation performance of the flexible printed board is required to extend the life of the LEI).

An example of satisfying this requirement is a structure (referred to as an aluminum bonded substrate) in which an expensive aluminum heat dissipating material made of aluminum is bonded to a flexible printed board. Further, there is also the aluminum bonded substrate in which the above-described aluminum heat dissipating material is processed into a three-dimensional shape in order to further improve the heat dissipation performance. In the aluminum bonded substrate having such a structure, the heat dissipation performance is improved by bonding the aluminum heat dissipating material. However, there is a problem that the price of the aluminum heat dissipating material is higher than the cost required for the material or processing of the flexible printed board. Further, devices are required to be lightweight in automotive lighting. However, such a structure in which a large number of such an aluminum heat dissipating material is bonded is contrary to such a demand for weight reduction.

As a countermeasure for such a problem, there is a structure disclosed in PATENT LITERATURE 1. In the structure disclosed in PATENT LITERATURE 1, since the aluminum heat dissipating material is not used, the weight reduction can be achieved.

CITATION LIST

Patent Literature

PATENT LITERATURE 1: JP-A-2011-249574

SUMMARY OF THE INVENTION

Problems to be Solved by the Invention

The structure disclosed in PATENT LITERATURE 1 is inferior in heat dissipation performance as compared with the aluminum bonded substrate in which the aluminum heat dissipating material is processed into the three-dimensional shape. In addition, in the structure disclosed in PATENT LITERATURE 1, a copper foil is hard. Therefore, it is necessary to perform a bending process or the like when incorporating it in a lamp house or the like of a vehicle at a customer site. As a result, there is also a problem of poor workability. Meanwhile, a copper substrate, an aluminum substrate or the like is used as a substrate in order to improve heat dissipation performance. There is a problem that it is difficult to bend these substrates. In addition, there is a problem that the aluminum substrate or the copper substrate which is a heat sink is thick, heavy and expensive.

The present invention has been made based on the above circumstances. An object of the present invention is to provide a flexible printed board which is improved in heart dissipation without using an aluminum heat dissipating material, is light in weight, has good processability, and can further reduce cost, and a method for manufacturing such a flexible printed board.

Solution to the Problems

According to a first aspect of the present invention, in order to solve the problem described above, provided is a flexible printed board on which a power consuming load is mounted. The flexible printed board includes: a front surface heat dissipation layer made of a copper foil and having a circuit portion on which the load is mounted; a thermally conductive resin layer having the front surface heat dissipation layer laminated to a front surface side thereof and having a thermal conductivity of 0.49 W/mK or more; and a rear surface heat dissipation layer made of a copper foil, laminated to a rear surface side of the thermally conductive resin layer, and having a thickness of 100 to 400% with respect to the front surface heat dissipation layer.

Further, in another aspect of the present invention, it is preferable that in the above-described invention, the thermally conductive resin layer contain an epoxy resin, a curing agent, a curing accelerator, a flexibility component, and a thermally conductive filler, and a blending amount of the thermally conductive filler in the thermally conductive resin layer is 30 vol % or more.

Moreover, in another aspect of the present invention, it is preferable that in the above-described invention, the thermally conductive filler contain one or more components selected from zinc oxide, titanium oxide, boron nitride, aluminum oxide, aluminum nitride, silicon carbide, hexagonal boron nitride and magnesium carbonate.

Further, in another aspect of the present invention, it is preferable that in the above-described invention, the rear surface heat dissipation layer is further provided with a cover coat layer on a rear surface side thereof, and the cover coat layer in a portion in which the rear surface heat dissipation layer is etched has a film thickness of 15 μm or less and a thermal emissivity of 0.68 or more.

Moreover, in another aspect of the present invention, it is preferable that in the above-described invention, the rear surface heat dissipation layer is further provided with an etched recess.

Further, in another aspect of the present invention, it is preferable that in the above-described invention, an elongation percentage of a portion having the cover coat layer laminated to the thermally conductive resin layer in a portion from which the front surface heat dissipation layer is removed on a front surface side of the recess is 19.5% or more.

Moreover, in another aspect of the present invention, it is preferable that in the above-described invention, the front surface heat dissipation layer is further provided with a wiring portion connected to the circuit portion, and a slit portion corresponding to the recess partially etched for bending or curving is provided on a rear surface side of the wiring portion.

Further, in another aspect of the present invention, it is preferable that in the above-described invention, there are further provided a mounting area including the circuit portion on which the load is mounted and a cable portion including the wiring portion and located between the mounting areas adjacent to each other and connecting the mounting areas. It is also preferable that the recess is formed on an end portion side of the rear surface heat dissipation layer in the cable portion so as to overlap an end portion side of the front surface heat dissipation layer in a plan view.

Moreover, in another aspect of the present invention, it is preferable that in the above-described invention, there are further provided a mounting area including the circuit portion on which the load is mounted; and a cable portion including the wiring portion and located between the mounting areas adjacent to each other and connecting the mounting areas. It is also preferable that a bent portion bent in a thickness direction is connected to an end portion side in a width direction intersecting a longitudinal direction of a portion to which the cable portion is connected in the mounting area, and at least the rear surface heat dissipation layer is provided in the bent portion.

Further, in another aspect of the present invention, it is preferable that in the above-described invention, the a surface heat dissipation layers are bonded to each other.

According to a second aspect of the present invention, provided is a method for manufacturing a flexible printed board on which a power consuming load is mounted, including: a first step of forming an uncured thermally conductive resin layer which is a thermally conductive resin layer having a thermal conductivity of 0.49 W/mK or more in a cured state on a copper foil as a front surface heat dissipation layer; a second step of bonding another copper foil having a thickness of 100 to 400% with respect to the front surface heat dissipation layer to the uncured thermally conductive resin layer, as a rear surface heat dissipation layer after the first step; and a third step of etching the copper foil to be the front surface heat dissipation layer and the other copper foil to be the rear surface heat dissipation layer to form the front surface heat dissipation layer and the rear surface heat dissipation layer.

Effects of the Invention

According to the present invention, it is possible to provide a flexible printed board which is improved in heat dissipation without using an aluminum heat dissipating material, is light in weight, has good processability, and can further reduce cost, and a method for manufacturing such a flexible printed board.

DESCRIPTION OF THE EMBODIMENTS

A flexible printed board 10 according to an embodiment of the present invention will be described below. In the following description, it is assumed that an X direction is a longitudinal direction of the flexible printed board 10, an X1 side is a right side in FIG. 1, and an X2 side is a left side. Further, it is assumed that a Z direction is a thickness direction of the flexible printed board 10, a Z1 is a far side (upper side; front surface side) of the page of FIG. 1, and a Z2 is a near side (lower side; rear surface side) of the page.
<Structure of Flexible Printed Board>

Figure 1:
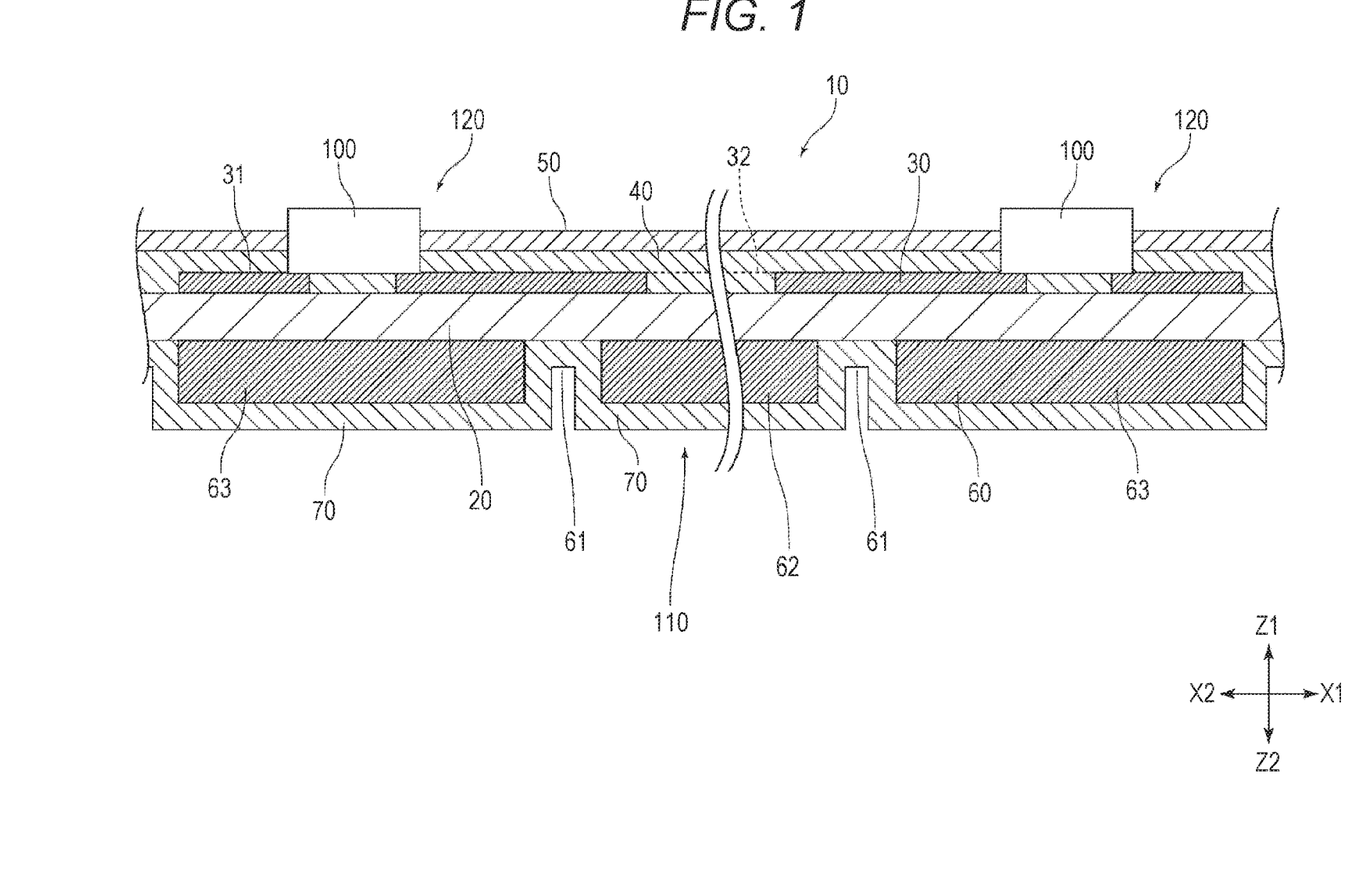
FIG. 1 is a side cross-sectional view showing a structure of a flexible printed board according to an embodiment of the present invention.

FIG. 1 is a side cross-sectional view showing a structure of the flexible printed board 10 according to the present embodiment. As shown in FIG. 1, the flexible printed board 10 includes a thermally conductive resin layer 20, a copper foil layer 30, an adhesive material layer 40, a cover material foil layer 50, a rear surface heat dissipation layer 60, a cover coat layer 70, and an LED 100 as its main constituent elements. They will be described below.

The thermally conductive resin layer 20 is a resin layer with good thermal conductivity. Specifically, the thermally conductive resin layer 20 is a material having a plurality of functions of thermal conductivity, adhesive properties, and insulating properties in combination. Generally, such a thermally conductive resin layer can be obtained by combining two or more kinds of materials. In general, an adhesive resin has a low thermal conductivity, and for example, in an epoxy resin used for a printed board, its thermal conductivity ranges from 0.16 W/(m·K) to 0.20 W/(m·K).

In order to improve the thermal conductivity and the insulating properties of such a resin, it is preferred that an insulating inorganic material having high thermal conductivity such as alumina, aluminum nitride, or silicon carbide is added as a filler to the resin, to form a composite resin. However, a cured thermally conductive resin layer 20 obtained by filling the above-mentioned filler into a composite composition including the epoxy resin and a component for curing the epoxy resin is brittle. As a result, it is difficult to ensure punching processability and bendability of a cable portion as the resin used for the flexible printed board 10.

In addition, when a filling amount of a thermally conductive filler is small, the thermal conductivity of the obtained resin is inevitably low. On the other hand, when the filling amount of the thermally conductive filler is excessive, the thermal conductivity is high. In contrast, the cured thermally conductive resin layer 20 is further brittle. Further, since an amount of the resin component is reduced, the adhesive properties to the copper foil layer 30 are reduced. Therefore, the adhesive properties, the processability, and the bendability are significantly deteriorated.

From such a background, it is necessary to add a flexibility component for making the resin flexible to the thermally conductive resin layer 20 used for the flexible printed board 10 of the present embodiment. In addition, it is desirable to adjust the type and an amount to be added of the flexibility component depending on the type and the filling amount of the thermally conductive filler. Here, in the thermally conductive resin layer 20 of the present embodiment, when an elastic modulus of the resin is around 1.3 GPa, it is determined to have low flexibility (high elastic modulus). Further, when the elastic modulus is around 0.5 GPa, it is determined to have moderate flexibility (moderate elastic modulus). Furthermore, when the elastic modulus is around 0.2 GPa, it is determined to have high flexibility (low elastic modulus). Here, a value around each value of the elastic modulus may be within a range of ±0.1 GPa of each numerical value, or may be within a range of ±0.2 GPa.

However, regarding low, moderate and high flexibility, it may be determined outside the above ranges. For example, an intermediate value between the above-mentioned high value and moderate value in the elastic modulus may be a threshold value, and when the elastic modulus is 0.9 GPa of the threshold value or more, it may be determined to have low flexibility (high elastic modulus). Further, an intermediate value between the moderate value and the low value in the elastic modulus may be a threshold value, and when the elastic modulus is more than 0.35 GPa of the threshold value and less than 0.9 GPa, it may be determined to have moderate flexibility (moderate elastic modulus). Furthermore, when the elastic modulus is 0.35 GPa or less, it may be determined to have high flexibility (low elastic modulus). However, the range of flexibility may be different from the range of these values.

As the epoxy resin for the flexible printed board 10, the epoxy resin such as bisphenol A type, bisphenol F type, cresol novolak type, or biphenyl type is generally used. As a curing agent for these epoxy resins, phenol novolak resin, dicyandiamide, acid anhydride, aromatic polyamine or the like is used, and as a curing accelerator for these epoxy resins, tertiary amine, imidazole, phosphine or the like is generally used.

As the flexibility component for the flexible printed board 10, acrylonitrile butadiene rubber, acrylic rubber, polyurethane, polyester or the like is generally used. Polyester or acrylic rubber is particularly preferably used as the flexibility component, and they have a high adhesive force retention, for example, even in an atmosphere at 150° C. Further, when they are used as the flexibility component in an atmosphere of high temperature and high humidity such as 85° C. and 85% RH, an insulation resistance value between wires of the thermally conductive resin can be kept high even after a voltage of 100 V is continuously applied.

The thermally conductive filler contains one or more materials selected from zinc oxide (ZnO), titanium oxide ($TiO_2$), boron nitride (BN), aluminum oxide ($Al_2O_3$), aluminum nitride (AlN), silicon carbide (SiC), hexagonal boron nitride (h-BN), and magnesium carbonate ($MgCO_3$), and the content is preferably 30 vol % or more from the viewpoint of thermal conductivity.

The thermal conductivity was experimentally determined and was as follows. Specifically, 100 parts by weight of bisphenol A type epoxy resin having an epoxy equivalent of 184 to 194 (JER (registered trademark) 828: product name, manufactured by Mitsubishi Chemical Corporation) as the epoxy resin, 11 parts by weight of dicyandiamide having an amine equivalent of 21 (JER CURE (registered trademark) DICY7: product name, manufactured by Mitsubishi Chemical Corporation) as the curing agent, 1 part by weight of imidazole (CUREZOL (registered trademark) 2E4MZ: product name, manufactured by Shikoku Chemicals Corporation) as the curing accelerator, and 92 parts by weight of acrylonitrile butadiene rubber (Nipol (registered trademark) 1052J: product name, manufactured by Zeon Corporation) as the flexibility component are dissolved and stirred in 550 parts by weight of methyl ethyl ketone to prepare a resin dissolved product. The dissolved product is applied to a 38 μm PET substrate with release treatment (PET38SK-1: product name, manufactured by Lintec Corporation) so that a thickness thereof after drying is 50 μm.

Thereafter, it was dried at 120° C. for 10 minutes to prepare a sheet-like solid resin composition. The 38 μm PET substrate with release treatment were laminated while peeling so that the laminated cured product made of the solid resin composition alone was about 1 mm thick. Thereafter, the product was press molded under conditions of 160° C. 2 MPa, and 60 minutes to prepare a sheet for measuring the thermal conductivity of a resin composition containing no thermally conductive filler. The thermal conductivity of the sheet was measured (thermal conductivity measuring device: Tokai Giken Co., Ltd. FIR-100). The thermal conductivity at this time was 0.23 W/mK.

In contrast, in the resin composition containing the thermally conductive filler, the contents of various insulating thermally conductive tillers were adjusted with stirring so that a solid component ratio was 20 to 36 vol % with respect to the above dissolved product. Thereafter, sheets were formed under the same conditions, and they were press laminated and cured to prepare samples for thermal conductivity measurement. The thermal conductivity of the samples was measured. Here, the thermal conductivity was 0.49 W/mK in the resin composition containing 20 vol % of titanium oxide (CR-50: product name, manufactured by Ishihara Sangyo Kaisha, Ltd.) having a thermal conductivity of 8 W/mK. Further, in the resin composition containing 30 vol % of the titanium oxide, the thermal conductivity was 0.73 W/mK. Still further, in the resin composition containing 36 vol % of the titanium oxide, the thermal conductivity was 0.88 W/mK. Therefore, in order to obtain the thermal conductivity of at least about 0.7 W/mK, the filling amount of the thermally conductive filler is preferably 30 vol % or more, and more preferably 35 vol % or more.

In the resin composition containing 20 vol % of fused silica (thermal conductivity: 1.3 W/mK, FB-5D: product name, manufactured by DENKA Co., Ltd.) having a thermal conductivity lower than that of titanium oxide, the thermal conductivity is 0.35 W/mK. That is, a value of the thermal conductivity of the resin composition varies depending on the thermal conductivity of the insulating filler used. Therefore, it is preferable to use a material having a thermal conductivity at least equal to or higher than the thermal conductivity of titanium oxide, and it is more preferable to use a material having thermal conductivity higher than that of titanium oxide, such as zinc oxide, boron nitride, aluminum oxide, aluminum nitride, silicon carbide, hexagonal boron nitride or magnesium carbonate.

A thickness of the thermally conductive resin layer 20 can be, for example, about 40 μm. Because its tear propagation resistance is equivalent to that of polyimide of 12.5 μm (½ mil) in this case. Further, since it is desirable to make the resin layer thin, the thickness is preferably set to 40 μm as described above. However, of course the thickness of the thermally conductive resin layer 20 may be 40 μm or more. Further, when a value of the tear propagation resistance is allowed to be small, the thickness of the thermally conductive resin layer 20 may be thinner than 20 μm.

Next, the copper foil layer 30 will be described. The copper foil layer 30 corresponds to a front surface heat dissipation layer described in each claim. The copper foil layer 30 is provided on the front surface side (Z1 side) of the thermally conductive resin layer 20. A circuit portion 31 and a wiring portion 32 are provided by a copper foil having a predetermined thickness. An example of the thickness of the copper foil of the copper foil layer 30 can be, for example, 35 μm. The copper foil of the copper foil layer 30 has a thermal conductivity of about 400 W/mK. On the other hand, in the embodiment to be described later, the copper foil is provided so that the thermal conductivity is in a range of 402 to 403 W/mK.

Here, in the copper foil layer 30, the copper foil on the entire front surface of the substrate before processing is etched to form the circuit portion 31 and the wiring portion 32 described above. The circuit unit 31 is a portion on which the LED (Light Emitting Diode) 100 is mounted. In this portion, a predetermined circuit pattern is formed. A lower portion of the LED 100 is connected to the circuit portion 31, for example, by soldering or the like. Further, the wiring portion 32 is a portion in which only a predetermined number of wirings are left, and the copper foil is removed in a portion other than the wiring. Since only the wiring portion 32 remains as the copper foil, a cable portion 110 which is more easily bent than the other portions of the flexible printed board 10 is formed. In the following description, it is assumed that a mounting area 120 is a portion having the circuit portion 31, with a load such as an LED 100 mounted thereon, and connected to the cable unit 110 (see also FIG. 8 to be described later).

The adhesive material layer 40 is a portion having adhesive properties and insulating properties. Then, the adhesive material layer 40 covers the above-mentioned copper foil layer 30. The adhesive material layer 40 is a part of a cover film together with the cover material layer 50. However, both may be separate. The cover material layer 50 is bonded to the copper foil layer 30 and the thermally conductive resin layer 20 via the adhesive material layer 40. As a material of the adhesive material layer 40, for example, an epoxy resin-based adhesive is available. However, as long as the adhesive properties are good, it may be formed from other materials. In addition, the adhesive material layer 40 may have any thickness as long as the adhesive properties are good. An example of the thickness can be, for example, in a range of 18 to 28 μm. However, it may be a thickness of a value outside this range.

The cover material layer 50 is a member having electrical insulating properties. For example, a film-like member is used. The cover material layer 50 is made of polyimide excellent in insulating properties and flexibility. However, materials other than polyimide may be used. An example of a thickness of the cover material layer 50 can be, for example, 25 μm (1 ml) or 12.5 μm (½ mil). However, other thicknesses may be used.

Next the rear surface heat dissipation layer 60 be described. The rear surface heat dissipation layer 60 is provided on the rear surface side (Z2 side) of the thermally conductive resin layer 20. Similarly to the copper foil layer 30, the rear surface heat dissipation layer 60 is formed by etching the copper foil having a predetermined thickness. Heat dissipation performance can be improved by the rear surface heat dissipation layer 60. Here, when the thickness of the rear surface heat dissipation layer 60 is thinner than that of the copper foil layer 30, thermal capacity of the rear surface heat dissipation layer 60 is smaller than that of the copper foil layer 30, and cooling performance is deteriorated. On the other hand, when the rear surface heat dissipation layer 60 exceeds 400% thickness of the copper foil layer 30, etching performance is deteriorated. Therefore, the thickness of the copper foil of the rear surface heat dissipation layer 60 is preferably within a range of 100% to 400% thickness of the copper foil layer 30. Note that the minimum value of the thickness of the copper foil layer 30 is 9 μm. Further, the minimum value of the thickness of the rear surface heat dissipation layer 60 is 35 μm. As long as the thickness values are not less than these values, the values are in a preferable range described above, but they may be outside this range. In the present embodiment, the heat dissipation performance depends on the thickness of the rear surface heat dissipation layer 60 more than the thickness of the copper foil layer 30.

In the rear surface heat dissipation layer 60, a slit portion 61 (corresponding to a recess) is formed by etching. For example, when the rear surface heat dissipation layer 60 having a thickness greater than or equal to that of the copper foil layer 30 is on the rear surface side of the thermally conductive resin layer 20, the bendability of the flexible printed board 10 and incorporation into a lamp house are deteriorated. On the other hand, by providing the slit portion 61 in the rear surface heat dissipation layer 60, such bendability of the flexible printed board 10 and the incorporation into the lamp house or the like are improved.

Figure 2:
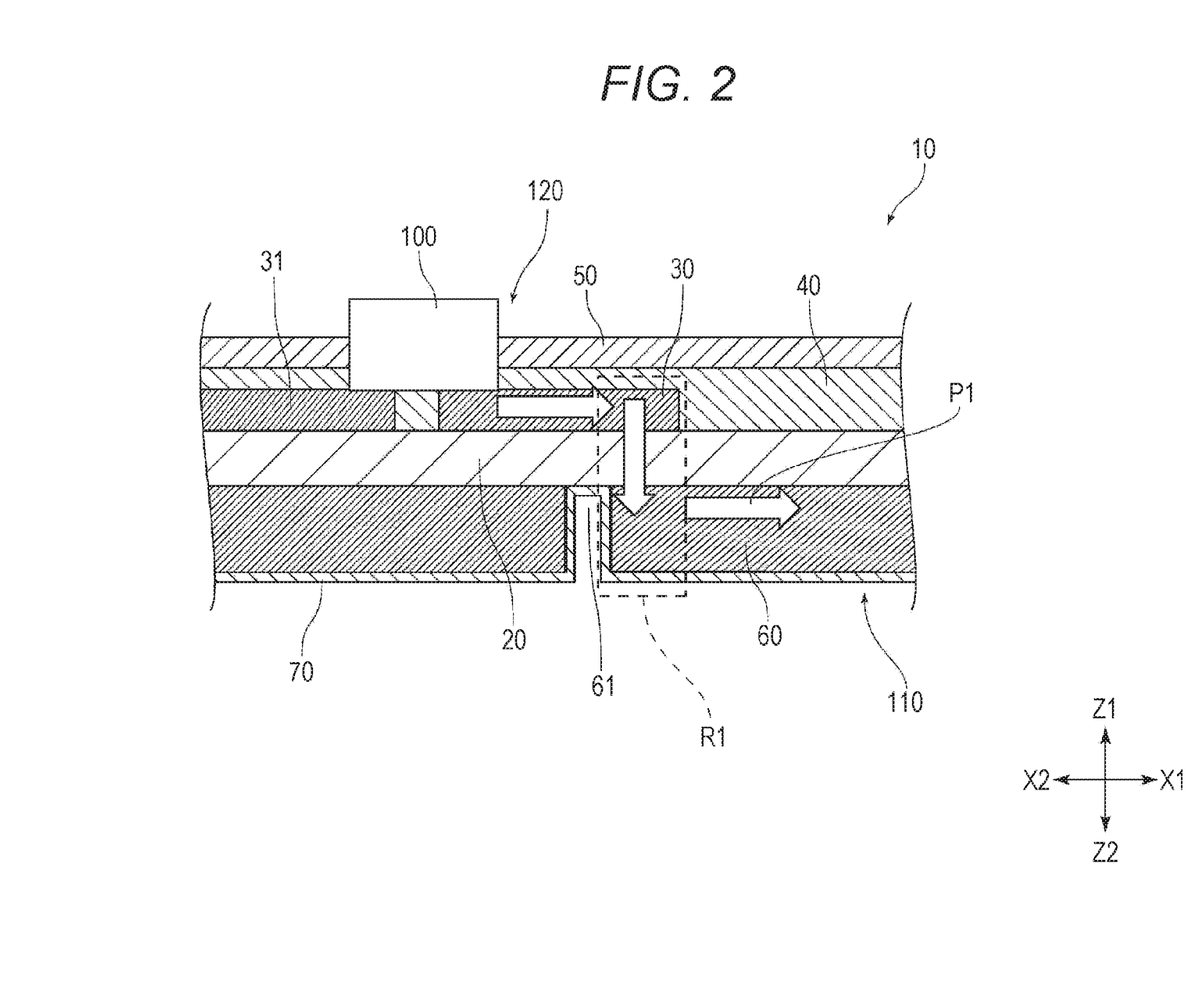
FIG. 2 is a side cross-sectional view showing a state in which an end portion side of a rear surface heat dissipation layer in a cable portion overlaps an end portion side of a copper foil layer to form a thermal diffusion path, in the flexible printed board shown in FIG. 1.

FIG. 2 is a side cross-sectional view showing a state in which an end portion side of the rear surface heat dissipation layer 60 of the cable portion 110 overlaps an end portion side of the copper foil layer 30 to form a thermal diffusion path P1. As shown in FIG. 2, the slit portion 61 is formed in the rear surface heat dissipation layer 60. Thus, the bendability of the cable portion 110 is facilitated. Here, the slit portion 61 is provided on the lower side (Z2 side) of the circuit portion 31 in the thickness direction (Z direction). Further, the end portion side of the rear surface heat dissipation layer 60 of the cable portion 110 approaches the Z2 side in the thickness direction. That is, when the flexible printed board 10 is viewed in a plan view, the end portion side of the circuit portion 31 and the end portion side of the rear surface heat dissipation 60 of the cable portion 110 overlap each other.

Thus, as shown in FIG. 2, heat generated in the LED 100 passes through the thermally conductive resin layer 20 at the shortest length and is transferred to the rear surface heat dissipation layer 60. As a result, the thermal diffusion path P1 through which the heat generated in the LED 100 is satisfactorily diffused to the rear surface heat dissipation layer 60 is formed in the flexible printed board 10.

In the following description, when the flexible printed board 10 is viewed in a plan view, a region overlapping the end portion side of the circuit portion 31 in the rear surface heat dissipation layer 60 of the cable portion 110 is defined as an overlap region R1. The rear surface heat dissipation layer 60 of the cable portion 110 is defined as a cable side rear surface heat dissipation laser 62. The rear surface heat dissipation layer 60 located below the circuit portion 31 other than the overlap region R1 is defined as a circuit side rear surface heat dissipation layer 63.

Here, in many cases, an area of the cable side rear surface heat dissipation layer 62 is larger than that of the circuit side rear surface heat dissipation layer 63. Therefore, this heat can be satisfactorily diffused by transferring the heat generated in the LED 100 to the cable side rear surface heat dissipation layer 62 via the thermal diffusion path P1.

In the structure shown in FIG. 1, the rear surface heat dissipation layer 60 is provided with the slit portion 61. In contrast, h surface heat dissipation layer 60 may not be provided with the slit portion 61. Further, in the structure shown in FIG. 2, the slit portion 61 is formed so that the end portion side of the circuit portion 31 and the end portion side of the rear surface heat dissipation layer 60 of the cable portion 110 overlap each other. In contrast, the slit portion 61 may be formed at a position in which the end portion side of the circuit portion 31 and the end portion side of the rear surface heat dissipation layer 60 of the cable portion 110 do not overlap each other.

The cover coat layer 70 is provided on the lower surface side (rear surface side; Z2 side) of the rear surface heat dissipation layer 60. The cover coat layer 70 is provided to prevent the rear surface heat dissipation layer 60 from being oxidized. Further, the cover coat layer 70 is provided to improve a thermal emissivity. That is, the copper foil constituting the rear surface heat dissipation layer 60 has a thermal emissivity of 0.05. On the other hand, the cover coat layer 70 has a thermal emissivity of, for example, 0.68. Therefore, thermal diffusion into the air due to natural convection is improved by forming the cover coat layer 70.

As such a cover coat layer 70, various materials having high thermal emissivity can be used. Considering that it can be easily coated on the rear surface heat dissipation layer 60, paint or ink can be used. As the ink, for example, there is one based on the MSS series (product name) manufactured by Seiko advance Ltd. Other inks may be used. Further, the insulating thermally conductive filler such as boron nitride, aluminum nitride, or alumina may be added to the ink.

The above-described ink tuned for the flexible printed board 10 has a thermal emissivity of, for example, 0.68. This is much better than the thermal emissivity of the copper foil. However, the thermal emissivity may be a value of 0.68 or more.

As a coating material for covering the rear surface heat dissipation layer 60, an adhesive material may be used. For example, in order to cover the rear surface heat dissipation layer 60 having a thickness of 70 μm, the adhesive material having a thickness of 70 μm is required. This is expensive as the coating material. Further, the flexible printed board 10 may be bonded to a casing of the lamp house or the like, so that the heat generated in the substrate can escape to the casing side. At this time, the adhesive material having such a thickness serves as a thermal resistance.

In contrast, when the above-described ink is used, the cover coat layer 70 can be formed in the form of a thin film having a film thickness of 15 μm or less by, for example, screen printing, in a pinhole-less manner. Therefore, the heat can be satisfactorily transferred to the casing side. In addition, the ink can also be applied to stepped portions such as the slit portion 61 and the like. The thickness of the cover coat layer 70 may have a film thickness of at least 5 μm or more in accordance with the type of the cover coat layer 70. Thus, it is possible to form the cover coat layer 70 in a pinhole-less manner. Note that an actual thickness of the cover coat layer 70 is preferably 5 μm to 15 μm. This is because the film thickness varies to some extent when the cover coat layer 70 is actually formed. Further, in this range, the thickness of the flexible printed board 10 does not increase so much.

This thickness of the cover coat layer 70 is not the thickness of the cover coat layer 70 covered by the rear surface heat dissipation layer 60 but the thickness of a portion in which the rear surface heat dissipation layer 60 is etched. Here, the above-described etched portion includes the slit portion 61 in FIGS. 1 and 2. However, as long as the rear surface heat dissipation layer 60 is etched, the etched portion may include a portion other than the slit portion 61. For example, when the circuit side rear surface heat dissipation layers 63 or the cable side rear surface heat dissipation layers 62 are opposed to each other with a gap corresponding to the slit portion 61 therebetween, the etched portion may include the gap. When there is no circuit side rear surface heat dissipation layer 63 or the cable side rear surface heat dissipation layer 62 adjacent to one side of the circuit side rear surface heat dissipation layer 63 and the cable side rear surface heat dissipation layer 62, it means the film thickness covered on the portion if it is the etched portion.

Incidentally, when the cover coat layer 70 is formed of the above-described ink, there is a problem that an elongation percentage is low. Therefore, when the copper foil layer 30 and the rear surface heat dissipation layer 60 are etched without considering the elongation percentage, it is difficult to punch the portion by press or the like. Accordingly, burrs or punched scraps tend to be generated. In order to solve such a punching problem, as long as the elongation percentage of the flexible printed board 10 as a composite material is 12.9% or more, there is no problem as a product. Further, it is confirmed that press punching property is further improved and preferable as long as the elongation percentage is 19.5% or more.

EXAMPLES

Figure 3:
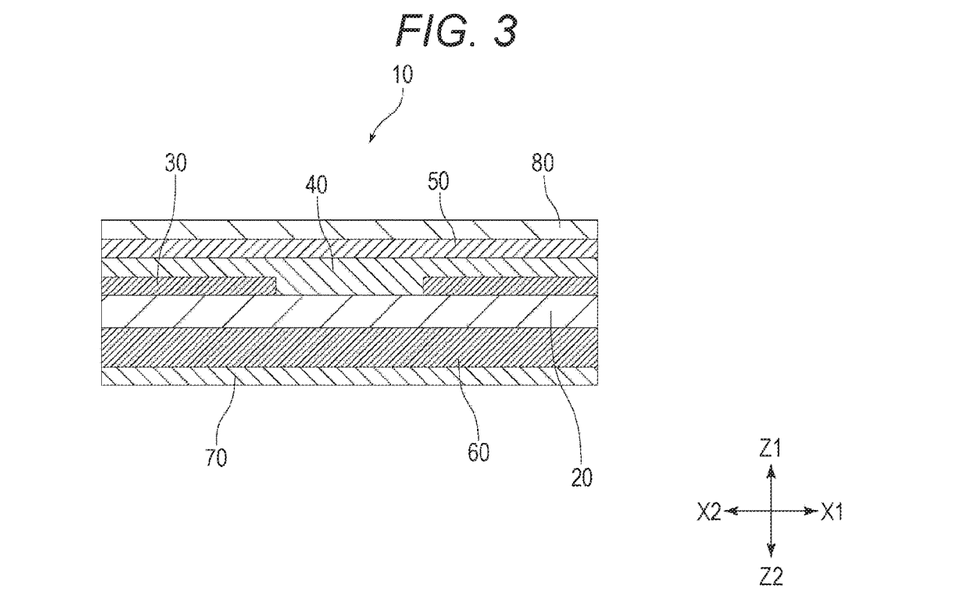
FIG. 3 is a side cross-sectional view showing a structure of the flexible printed board according to Example 1 and Example 2 used for evaluating heat dissipation performance.

Next, Examples of the present invention will be described.
(1) Evaluation of Heat Dissipation Evaluation of the heat dissipation performance of the flexible printed board based on the above-described structure will be described. FIG. 3 is a side cross-sectional view showing the structure of the flexible printed board according to Example 1 and Example 2 used for evaluating the heat dissipation performance. In Example 1, the thickness of the thermally conductive resin layer 20 is 40 μm. For the thermally conductive resin layer 20, one having a thermal conductivity adjusted to 0.8 (W/mK) depending on a ratio and the like of the thermally conductive filler is used. Then, this is applied to the copper foil layer 30. The thickness of the copper foil layer 30 is 35 μm. The thickness of the adhesive material layer 40 varies depending on the portion, and is in a range of 18 to 28 μm.

In the cover material layer 50, the adhesive material having a thickness of 18 to 28 μm is applied to polyimide having a thickness of 25 μm, and a white coating layer 80 having a thickness of 25 μm is further formed on the surface. The thickness of the rear surface heat dissipation layer 60 is different between Example 1 and Example 2. Specifically, the copper foil having a thickness of 70 μm is used in Example 1. Then, it is bonded to the thermally conductive resin layer 20. On the other hand, the copper foil having a thickness of 35 μm is used in Example 2 and is bonded to the thermally conductive resin layer 20.

A surface area of one surface side of the flexible printed boards 10, 10A, 10B in Example 1, Example 2, Comparative Example 1 and Comparative Example 2 is 7240 mm$^2$, and a length in the longitudinal direction (X direction) is 340 mm. A distance between the LEDs 100 is 30 mm at the maximum and 24 mm at the minimum. On the other hand, in the structures of Example 1 and Example 2, the copper foil of the rear surface heat dissipation layer 60 is etched. Its surface area is 6041 mm$^2$.

Further, the cover coat layer 70 is coated with ink based on MS8 series (product name) manufactured by Seiko advance Ltd. as described above. Its thickness is 15 μm. The thermal emissivity of the cover coat layer 70 is 0.68.

The thermal conductivity and the thermal emissivity of each constituent element of Example 1 and Example 2 were measured. The measurement results are shower Table 1.

Regarding the thermal conductivity of the above-described resins such as the cover material layer 50, the adhesive material layer 40, the thermally conductive resin layer 20, and the cover coat layer 70, a thermal diffusivity was measured by a temperature wave thermal analysis method (ai-Phase Mobile 1u: ai-Phase Co., Ltd., conforming to ISO-22007-3) and the thermal conductivity was calculated from the product of thermal diffusivity, density and specific heat. The density was measured by the Archimedes method (electronic balance GR-202: A&D) and the specific heat was measured by the DSC method (DSCQ200: TA. Instruments Japan Inc., conforming to JIS K7123). The thermal conductivity of metal was measured by the Archimedes method using a measuring apparatus manufactured by A&D Co., Ltd. The specific heat was measured by the DSC method using a measuring apparatus (DSCQ200; conforming to JIS K7123) manufactured by TA Instruments Japan Inc. The thermal emissivity was measured using an emissivity measuring device (TSS-5X) of Japan Sensor Corporation for a portion to be an actual heat sink surface.

TABLE 1

Double sided heat dissipation FPC Rear surface heat dissipation layer: 70 μm

| Thermal conductivity (W/mK) | Cover film | Cover material layer | 0.13 |
|---|---|---|---|
| | | Adhesive material layer | 0.17 |
| | Base material | Copper foil layer | 402 |
| | | Thermally conductive resin layer | 0.8 |
| | | Rear surface heat dissipation layer (Copper foil) | 402 |
| | | Cover coat layer | 0.17 |
| Thermal emissivity | | Cover coat layer | 0.68 |
| | | White coat layer | 0.91 |

Figure 4:
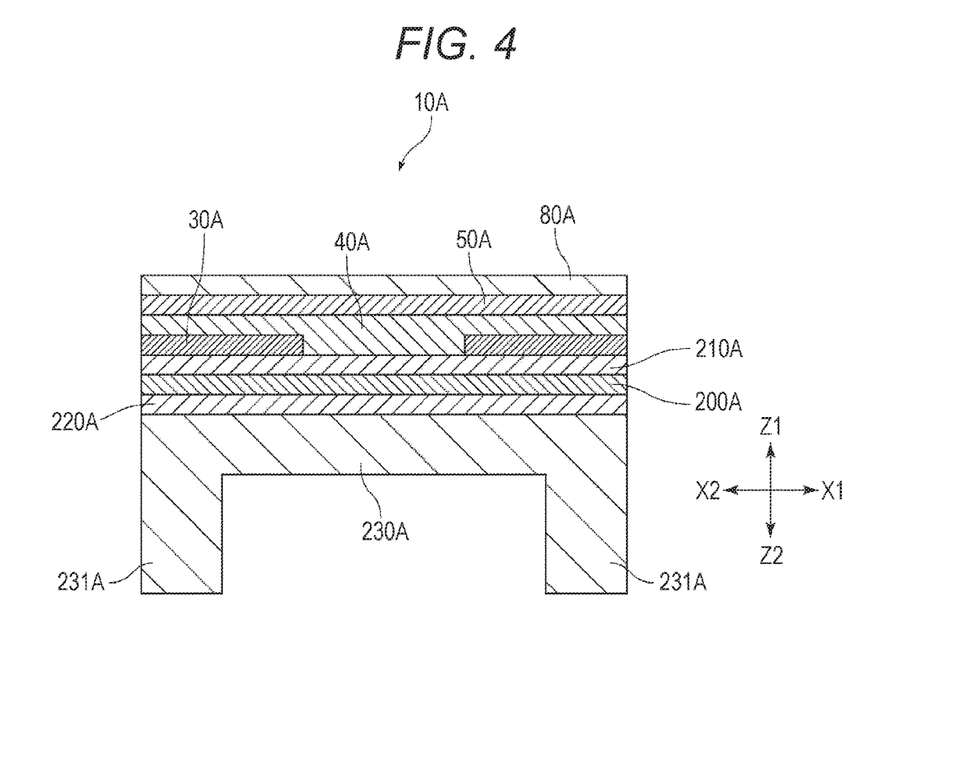
FIG. 4 is a side cross-sectional view showing a structure of the flexible printed board according to Comparative Example 1 used for evaluating the heat dissipation performance.

FIG. 4 is a side cross-sectional view showing the structure of the flexible printed board 10A according to Comparative Example 1 used for evaluating the heat dissipation performance. In the structure shown in FIG. 4, there is no thermally conductive resin layer 20 in Example 1 and Example 2. Instead of the thermally conductive resin layer 20, there is a polyimide layer 200A having a thickness of 25 μm, and there is an adhesive material layer 210A with a thickness of 10 to 15 μm on the front surface side of the polyimide layer 200A. On the front surface side of the adhesive material layer 210A, there is a copper foil layer 30A having a thickness of 35 μm like the copper foil layer 30 described above. Further, on the front surface side of the copper foil layer 30A, there is an adhesive material layer 40A having a thickness of 18 to 28 μm like the adhesive material layer 40. Furthermore, on the front surface side of adhesive material layer 40A, there is a polyimide cover material layer 50A having a thickness of 25 μm like the cover material layer 50. Still further, a white coating layer 80A having a thickness of 25 μm is formed on the front surface side of the cover material layer 50A in the same manner as described above.

On the other hand, on the rear surface side of the polyimide layer 200A, there is a reinforcing-plate adhesive material layer 220A having a thickness of 25 μm, and on the rear surface side of the reinforcing-plate adhesive material layer 220A, there is a three-dimensionally bent aluminum heat dissipating material 230A. The aluminum heat dissipating material 230A is provided with a leg portion 231A, and a length of the leg portion 231A from a surface of the aluminum heat dissipating material 230A is 10 mm.

In the flexible printed board 10A according to Comparative Example 1, a heat dissipation area of the aluminum heat dissipating material 230A is 13690 mm². A deign of 8635 mm³ when converted into volume was adopted. A measurement portion in the flexible printed board 10A was a portion in which the aluminum heat dissipating material 230A having a volume of 570 mm³ was bonded at a bonding area (an area of a bonded portion) of 149 mm².

The thermal conductivity and the thermal emissivity of each constituent element of Comparative Example 1 were measured. The measurement results are shown in Table 2. In this measurement, measurements were performed using the same measuring apparatuses as the measuring apparatuses of Example 1 and Example 2.

TABLE 2

FPC with current aluminum heat dissipating material

| Thermal conductivity (W/mK) | Cover film | Cover material layer | 0.13 |
|---|---|---|---|
| | | Adhesive material layer | 0.17 |
| | Base material | Copper foil layer | 402 |
| | | Adhesive material layer | 0.16 |
| | | Polyimide layer | 0.13 |
| | | Reinforcing-plate adhesive material layer | 0.15 |
| | | Aluminum heat dissipating material | 138 |
| Thermal emissivity | | Aluminum heat dissipating material | 0.05 |
| | | White coat layer | 0.91 |

Figures 5, 6:
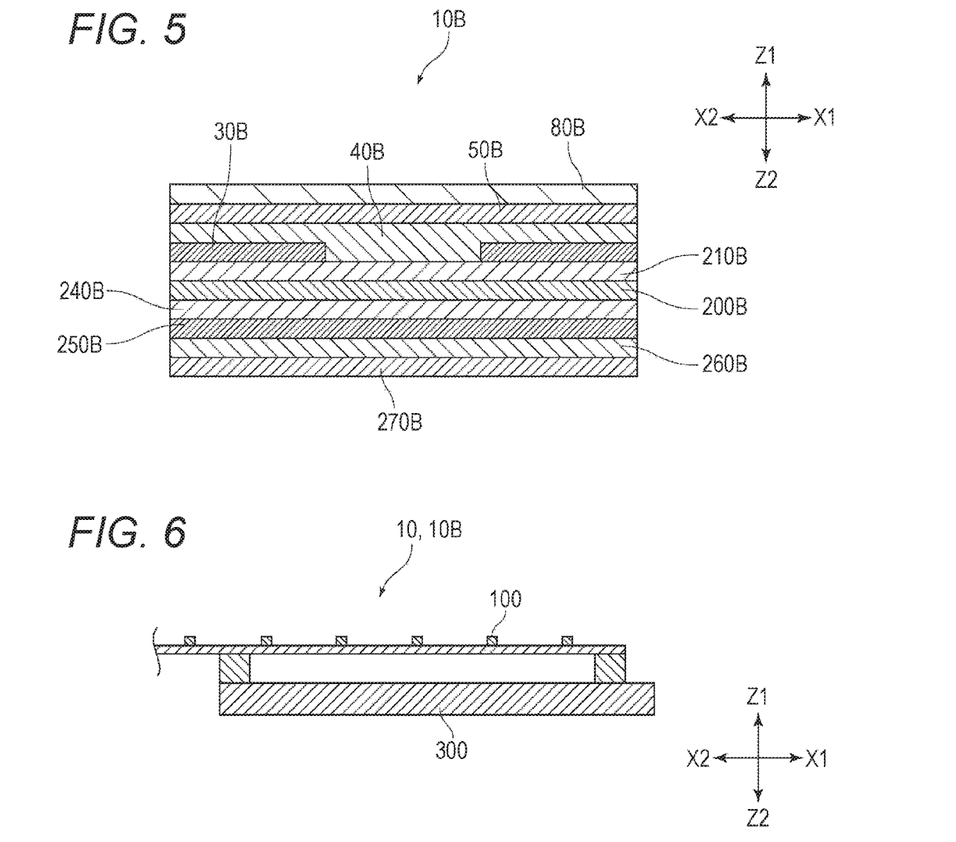
FIG. 5 is a side cross-sectional view showing a structure of a flexible printed board 10B according to Comparative Example 2 used for evaluating the heat dissipation performance.
FIG. 6 is a schematic view showing a placed state of the flexible printed boards of Example 1, Example 2, and Comparative Example 2 at the time of heat dissipation evaluation.

FIG. 5 is a side cross-sectional view showing the structure (double-sided copper clad board structure) of the flexible printed board 10B according to Comparative Example 2 used for evaluating the heat dissipation performance. The structure shown in FIG. 5 includes a copper foil layer 30B having the same thickness as the copper foil layer 30A, an adhesive material layer 40B having the same thickness as the adhesive material layer 40A, a white coating layer 80B having the same thickness as the above-described white coating layer 80A, a polyimide layer 200B having the same thickness as the above-described polyimide layer 200A, and an adhesive material layer 210B having the same thickness as the above-described adhesive material layer 210A.

On the rear surface side of the polyimide layer 200A, there is an adhesive material layer 240B having the same thickness as the above-described adhesive material layer 210B. On the rear surface side of the adhesive material layer 240B, there is a copper foil layer 250B having a thickness of 35 μm. On the rear surface side of the copper foil layer 250B, there is an adhesive material layer 260B having a thickness of 18 to 28 μm. On the rear surface side of the adhesive material layer 260B, there is a polyimide layer 270B having a thickness of 25 μm. The adhesive material layer 260B and the polyimide layer 270B constitute the cover film. The thermal conductivity and the thermal emissivity of each constituent element of Comparative Example 2 were measured. The measurement results are shown in Table 3.

TABLE 3

Comparative Example 2 Double-sided copper clad board

| Thermal conductivity (W/mK) | Cover film | Cover material layer | 0.13 |
|---|---|---|---|
| | | Adhesive material layer | 0.17 |
| | Base material | Copper foil layer | 402 |
| | | Adhesive material layer | 0.16 |
| | | Polyimide layer | 0.13 |
| | | Adhesive material layer | 0.16 |
| | | Copper foil layer | 0.15 |
| | Cover film | Adhesive material layer | 0.17 |
| | | Polyimide layer | 0.13 |

TABLE 3-continued

| Comparative Example 2 Double-sided copper clad board | | |
| --- | --- | --- |
| Thermal emissivity | Polyimide layer | 0.9 |
| | White coat layer | 0.91 |

Further, with respect to each structure of Example 1, Example 2, Comparative Example 1 and Comparative Example 2, the heat dissipation performance was evaluated. In the evaluation of the heat dissipation performance, 14 pieces of LEDs 100 arranged in series, having a forward voltage (VF) of 3.3 V and a forward current (IF) of 350 mA are used in the structures of the above-described Example 1, Example 2, Comparative Example 1 and Comparative Example 2. The LED 100 having a thermal resistance of 25° C./W is used. The LED 100 was energized for 4 hours at 280 mA (41.2 V) with a DC power supply (product name: PMC1100; manufactured by Kikusui Electronics Corporation).

Regarding temperature measurement, a temperature (cathode temperature) of a cathode portion just under the LED 100 was measured with a thermocouple and a temperature (junction temperature: Tj) of a junction portion of the LED 100 was calculated by the following equation (1) based on the thermal resistance of the LED 100.

$$Tj = \text{(cathode temperature)} + \text{(LED thermal resistance)} \times \text{(power consumption per LED light)} \quad \text{(Equation 1)}$$

The heat dissipation performance is better as the above-described junction temperature Tj is lower. An ambient temperature during the measurement was 26 to 27° C.

FIG. 6 is a schematic view showing a placed state of the flexible printed boards 10 and 10B of Example 1, Example 2, and Comparative Example 2 at the time of heat dissipation evaluation. In evaluating the heat dissipation of the flexible printed boards 10 and 10B of Example 1, Example 2, and Comparative Example 2, as shown in FIG. 6, the measurement was carried out by placing the flexible printed boards on polystyrene foam 300 so as to be in a hollow state with a height of 10 cm from a placement surface.

Figure 7:
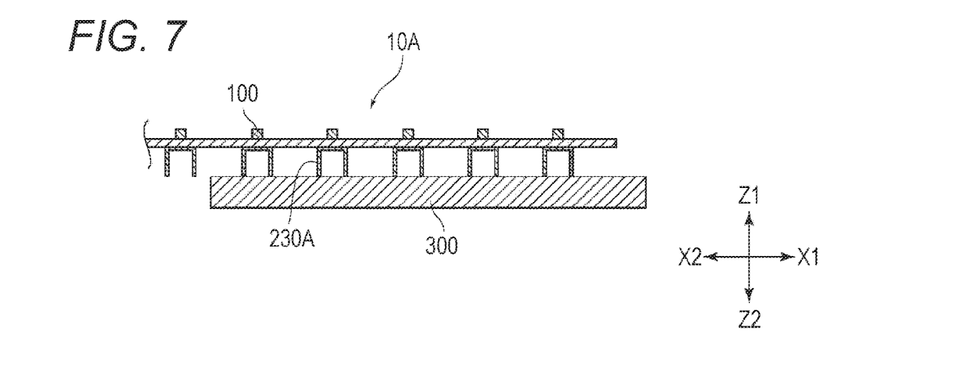
FIG. 7 is a schematic view showing the placed state of the flexible printed board of Comparative Example 1 at the time of heat dissipation evaluation.

FIG. 7 is a schematic view showing the placed state of the flexible printed board 10A of Comparative Example 1 at the time of heat dissipation evaluation. Also in evaluating the heat dissipation of the flexible printed board 10A of Comparative Example 1, as shown in FIG. 7, the measurement was carried out by placing the flexible printed boards on the polystyrene foam 300 so as to be in a hollow state with a height of 10 cm from the placement surface.

The measurement results of the junction temperature Tj in Example 1, Example 2, Comparative Example 1 and Comparative Example 2 are shown in Table 4. In Table 4, the cathode temperature and the ambient temperature are also shown in addition to the junction temperature Tj.

TABLE 4

| | Comparative Example 1 | Comparative Example 2 | Example 1 | Example 2 |
| --- | --- | --- | --- | --- |
| Cathode temperature (° C.) | 83.8 | 93.9 | 85.8 | 88.5 |
| Ambient temperature (° C.) | 27 | 26 | 27 | 27 |
| Tj (° C.) | 104 | 115 | 106 | 109 |

From the measurement results in Table 4, it was confirmed that the junction temperature in Example 1 is equivalent to the junction temperature Tj of the flexible printed board to which the aluminum heat dissipating material 230A of Comparative Example 1 is attached. Here, in the flexible printed board 10 of Example 1, since the aluminum heat dissipating material 230A is not used, it can be manufactured at low cost. Further, since the step of laminating the aluminum heat dissipating material 230A is not necessary, it is also easily manufactured. Further, in the flexible printed board 10 of Example 1, since the aluminum heat dissipating material 230A is not used, it can be made lighter than the flexible printed board of the Comparative Example 1. Furthermore, since the aluminum heat dissipating material 230A is not attached, it can be incorporated in the casing such as a lamp house without requiring an extra space.

As compared with Comparative Example 1 and Example 1, the junction temperature Tj is high in the flexible printed board 10 in which the thickness of the rear surface heat dissipation layer 60 is 35 μm in Example 2. That is, the heat dissipation performance is somewhat inferior. However, in the structure of Example 2, it is possible to further improve the heat dissipation performance by enlarging the heat dissipation area. In the present embodiment, a structure in which the heat dissipation layers such as the copper foil layer 30 and the rear surface heat dissipation layer 60 are present on both surfaces of the flexible printed board 10 is used. In this case, even if the heat dissipation area is increased, the processing cost hardly changes unless reducing the number of pieces as the product. Therefore, it is easy to provide the heat dissipation layers on the both surfaces of the board.

The structures of Example 1 and Example 2 have good heat dissipation performance as compared with the structure of Comparative Example 2 (structure in which the copper foil layers are provided on the both surfaces of the board) including the copper foil layer 250B having a thickness of 35 μm.

(2) Evaluation of Punching Property

Next, evaluation of punching property of the flexible printed board will be described. This evaluation is based on the structure including the thermally conductive resin layer 20, the copper foil layer 30, the adhesive material layer 40, the cover material layer 50, the rear surface heat dissipation layer 60, and the cover coat layer 70, which have the same thickness as in Example 1. However, a punched portion by pressing is a portion in which the copper foil layer 30 and the rear surface heat dissipation layer 60 are etched (in the rear surface heat dissipation layer 60, it corresponds to a portion in which the recess is formed). Therefore, in the evaluation of punching property, a structure in which the copper foil layer 30 and the rear surface heat dissipation layer 60 are removed by etching is evaluated.

When punching out an outer shape of the product of the flexible printed board 10 by pressing or the like, the thermally conductive resin layer 20 and the cover coat layer 70 are present in the structure. Among there cover coat layer 70 has a low elongation percentage. Therefore, there is a problem that the burrs or the punched scraps tend to be generated during press working. This problem is caused by low elongation (flexibility) of the flexible printed board 10 which is a composite material having the thermally conductive resin layer 20 and the cover coat layer 70. Therefore, the elongation percentage and the punching property of the flexible printed board 10 as such a composite material were evaluated.

For the thermally conductive resin layer 20, three types having low flexibility, high flexibility, and intermediate flexibility were evaluated. For the thickness of the cover coat layer 70, the press punching property and the elongation percentage of four types having a thickness of 0 μm (none), 15 μm, 35 μm, and 50 μm were evaluated in combination with the flexibility of the above-described thermally conductive resin layer 20.

The elongation percentage was measured with a sample size conforming to IPCTM 650 2.4.19 standard using a tensile tester (product name: AG-IS; manufactured by Shimadzu. Corporation) with load cell 100N. A gauge length in this sample was 100 mm, and the evaluation was carried out at a test speed of 50 mm/min. In preparing samples for a tensile test, punching was carried out with a punching blade (product name: Super Straight Cutter) manufactured by Dumbbell Co., Ltd. so as not to crack at the time of sample preparation, and after confirming that there was no crack after punching, the tensile test was carried out. The test results are shown in Table 5.

In Table 5, those with the thermally conductive resin layer 20 having low flexibility of 1.34 GPa correspond to Examples 3 to 5. Among them, one with the cover coat layer 70 having a thickness of 0 μm (none) corresponds to Example 3. One with the cover coat layer 70 having a thickness of 15 μm corresponds to Example 4. One with the cover coat layer 70 having a thickness of 35 μm corresponds to Example 5. Further, those with the thermally conductive resin layer 20 having a moderate flexibility of 0.49 GPa corresponds to Examples 6 to 9. Among them, one with the cover coat layer 70 having a thickness of 0 μm (none) corresponds to Example 6. One with the cover coat layer 70 having a thickness of 15 μm corresponds to Example 7. One with the cover coat layer 70 having a thickness of 35 μm corresponds to Example 8. One with the cover coat layer 70 having a thickness of 50 μm corresponds to Example 9. Further, those with the thermally conductive resin layer 20 having a high flexibility of 0.21 GPa correspond to Examples 10 to 13. Among them, one with the cover coat layer 70 having a thickness of 0 μm (none) corresponds to Example 10. One with the cover coat layer 70 having a thickness of 15 μm corresponds to Example 11. One with the cover coat layer 70 having a thickness of 35 μm corresponds to Example 12. One with the cover coat layer 70 having a thickness of 50 μm corresponds to Example 13.

70 is formed on each of the thermally conductive resin layers 20 having a thickness of 40 μm, since the elongation percentage of the cover coat layer 70 is low, the elongation percentage is reduced. However, when the thermally conductive resin layer 20 having high flexibility was used, the elongation percentage was 19.5% or more even when the cover coat layer 70 having a thickness of 35 μm was formed.

In Table 5, when the punching property is excellent, generation of burrs or punched scraps is very small and the product is very good. When the punching property is good, the generation of burrs or punched scraps is small and there is no problem as the product. When the punching property is bad, the generation of burrs or punched scraps is much and there is a problem as the product. As shower Table 5, in general, when the elongation percentage is high, the generation of burrs or punched scraps is reduced. However, in any case of when the flexibility of the thermally conductive resin layer 20 is low, when the flexibility is medium, and when the flexibility is high, if the elongation percentage is 12.9% or more, there is no problem as the product, and it is in a preferable range. When the elongation percentage is 19.5% or more, it is more preferable because the press punching property is further improved.

<Manufacturing Method>

Next, a method for manufacturing the flexible printed board 10 will be described. When manufacturing the flexible printed board 10, first, the copper foil to be the copper foil layer 30 is prepared. The resin to be the thermally conductive resin layer 20 is applied to the copper foil to form an uncured thermally conductive resin layer 20 (first step). Thereafter, the copper foil to be the rear surface heat dissipation layer 60 is prepared, and the copper foil is bonded to the uncured thermally conductive resin layer 20 described above (second step).

Thereafter, etching is performed on each of the copper foil of the copper foil layer 30 and the copper foil of the rear surface heat dissipation layer 60 to form the copper foil layer 30 and the rear surface heat dissipation layer 60 (third step). Specifically, a dry film is bonded to each of the copper foil of the copper foil layer 30 and the copper foil of the rear

TABLE 5

| | Example 3 | Example 4 | Example 5 | Example 6 | Example 7 | Example 8 | Example 9 | Example 10 | Example 11 | Example 12 | Example 13 |
|---|---|---|---|---|---|---|---|---|---|---|---|
| Thermally conductive resin layer | Flexibility: low | | | Flexibility: moderate | | | | Flexibility: high | | | |
| Cover coat layer (μm) | none | 15 | 35 | none | 15 | 35 | 50 | none | 15 | 35 | 50 |
| Elongation percentage (%) | 25.9 | 12.9 | 3.8 | 44.4 | 22.5 | 11.9 | 4.5 | 76.7 | 26.8 | 19.5 | 11.2 |
| Press punching property | Excellent | Good | Bad | Excellent | Excellent | Good | Bad | Excellent | Excellent | Excellent | Good |

Excellent: generation of punched scraps and burrs is very small
Good: generation of punched scraps and burrs is small
Bad: generation of punched scraps and burrs is much As a result of this test, for one having the thermally conductive resin layer 20 of low flexibility, the elongation percentage as a single body was 25.9%. On the other hand, the elongation percentage of one having high flexibility as a single body was 76.7%. Further, when the cover coat layer surface heat dissipation layer 60. Thereafter, exposure is performed by ultraviolet irradiation or the like, and after the exposure, the uncured dry film is removed to obtain a predetermined pattern shape. Thereafter, the etching is performed. Further, the dry film is peeled off. Thus, an etching pattern is formed in the copper foil layer 30 and the rear surface heat dissipation layer 60.

Thereafter, the ink having high thermal emissivity described above is applied to the rear surface heat dissipation layer 60 to form the cover coat layer 70. Further, the cover film having the adhesive material layer 40 and the cover material layer 50 is bonded to the copper foil layer 30. Incidentally, before or after this bonding, the LED 100 may be mounted on the circuit portion 31.

Thereafter, the punching and bending are appropriately performed at predetermined places. Thus, the flexible printed board 10 as shown in FIG. 1 is formed.

<Effects>

According to the flexible printed board 10 having the above-described structure and the method for manufacturing the flexible printed board 10, the following effects are obtained.

That is, the flexible printed board 10 is made of a copper foil, and includes the copper foil layer 30 (corresponding to the front surface heat dissipation layer) having the circuit portion 31 on which the LED 100 corresponding to the load is mounted, and the thermally conductive resin layer 20 having the copper foil layer 30 laminated on the surface side thereof, and having a thermal conductivity of 0.49 W/mK or more. The flexible printed board 10 further includes the rear surface heat dissipation layer 60 made of a copper foil, laminated to the rear surface side of the thermally conductive resin layer 20, and having a thickness of 100 to 400% with respect to the copper foil layer 30.

With such a structure, in the flexible printed board 10 of the present embodiment, it is possible to improve heat dissipation performance without using the aluminum heat dissipating material. Further, the aluminum heat dissipating material like the conventional structure is not used. Therefore, it is possible to reduce the weight. Further, in the structure disclosed in Patent Document 1, the copper foil is hard and the processability such as bending is inferior. However, in the flexible printed board 10 of the present embodiment, since the thickness of the rear surface heat dissipation layer 60 is within a range of 100 to 400% with respect to the copper foil layer 30, the processability is also good. Further, an expensive aluminum heat dissipating material is not used. Therefore, it is possible to reduce the man-hour required for processing and attaching. This makes it possible to reduce the cost.

In the flexible printed board 10A according to Comparative Example 1 shown in FIG. 4, there is the polyimide layer 200A having a low thermal conductivity like the conventional flexible printed board. Therefore, the polyimide layer 200A serves as the thermal resistance, and the heat dissipation performance of the flexible printed board 10 is deteriorated. In contrast, in the flexible printed board 10 of the present embodiment, the polyimide layer 200 A is not provided. Further, the thermally conductive resin layer 20 is newly provided. Therefore, it is possible to satisfactorily transfer the heat generated by the load such as the LED 100 to the rear surface heat dissipation layer 60 side. Therefore, it is possible to improve the heat dissipation performance of the flexible printed board 10, thereby suppressing a temperature rise.

Further, in the present embodiment, the thermally conductive resin layer 20 contains the epoxy resin, the curing agent, the curing accelerator, the flexibility component, and the thermally conductive filler. Furthermore, a blending amount of the thermally conductive filler in the thermally conductive resin layer 20 can be set to 30 vol % or more. In this case, it is possible to obtain the thermal conductivity of 0.70 or more, thereby improving the heat dissipation performance.

Further, in the present embodiment, the thermally conductive filler contains one or more materials selected from zinc oxide, titanium oxide, boron nitride, aluminum oxide, aluminum nitride, silicon carbide, hexagonal boron nitride and magnesium carbonate. In this case, the thermally conductive filler can be easily blended in the epoxy resin or the like. The thermal conductivity can be adjusted by adjusting the blending amount.

Further, in the present embodiment, the cover coat layer 70 is provided on the rear surface side of the rear surface heat dissipation layer 60. The cover coat layer 70 has a film thickness of 15 µm or less and a thermal emissivity of 0.68 or more. Therefore, it is possible to prevent the cover coat layer 70 from being the thermal resistance. Further, it is possible to satisfactorily dissipate heat by utilizing thermal radiation to the outside.

Further, in the present embodiment, the rear surface heat dissipation layer 60 is provided with the etched slit portion 61 (corresponding to the recess). Therefore, it is possible to easily perform the processing such as punching and bending by utilizing the slit portion 61, thereby improving the processability.

Further, in the present embodiment, in a portion having the copper foil layer 30 removed on the front surface side in the etched portion (portion in which the recess is formed) of the rear surface heat dissipation layer 60, the elongation percentage of a portion having the cover coat layer 70 laminated to the thermally conductive resin layer 20 is 19.5% or more. Therefore, it is possible to reduce the generation of burrs, punched scraps or the like during punching by pressing or the like. It is also possible to improve the punching property.

Furthermore, in the present embodiment, the copper foil layer 30 is provided with the wiring portion 32 connected to the circuit portion 31. The slit portion 61 partially etched for bending or curving the substrate is provided on the rear surface side of the wiring portion 32. Therefore, the flexible printed board 10 can be easily bent. Further, the flexible printed board 10 can be easily curved. Therefore, it is possible to easily incorporate the flexible printed board 10 into the lamp house or the like.

Further, in the present embodiment, there is the mounting area 120 including the circuit portion 31 on which the load such as the LED 100 is mounted. The cable portion 110 connecting the mounting areas 120 is provided between the adjacent mounting areas 120. The slit portion 61 is formed so that the end portion side of the rear surface heat radiation layer 60 in the cable portion 110 overlaps the end portion side of the copper foil layer 30 when the flexible printed board 10 is viewed in a plan view. Therefore, the heat generated by the load such as the LED 100 passes through the thermally conductive resin layer 20 in the shortest path and is transferred to the rear surface heat dissipation layer 60. Thus, even if the rear surface heat dissipation layer 60 is divided by the slit portion 61, it is possible to use the rear surface heat dissipation layer 60 as a heat dissipation portion having a large area, thereby improving the heat dissipation performance.

Modification

Although one embodiment of the present invention has been described above, the present invention can be variously modified. This will be described below.

Figure 8:
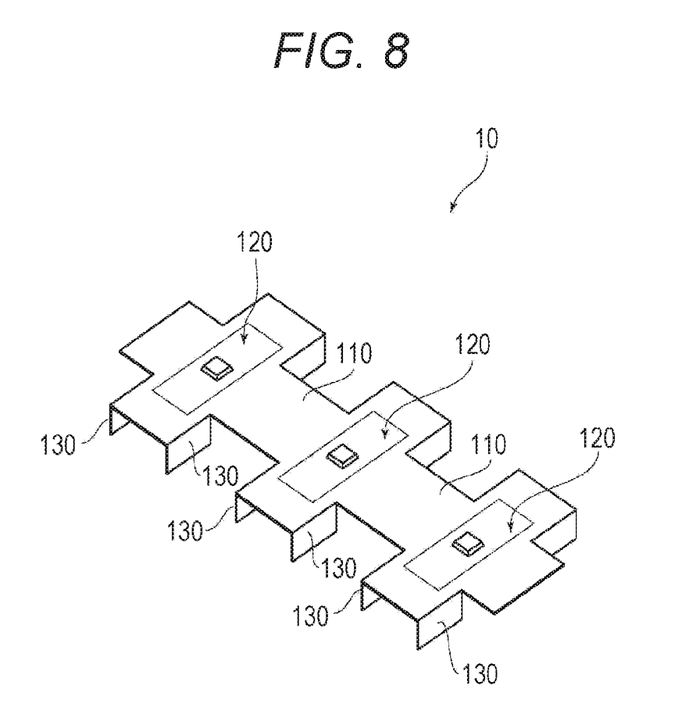
FIG. 8 is a view showing a structure of the flexible printed board according to a modification of the present invention.

In the above-described embodiment, the flexible printed board 10 may be appropriately bent to expand heat dissipation performance. This example is shown in FIG. 8. FIG. 8 is a view showing a structure of the flexible printed board 10S according to a modification of the present invention. In the structure shown in FIG. 8, a bent portion 130 bent in the thickness direction is connected to the end portion side in the width direction intersecting the longitudinal direction of a portion to which the cable portion 110 is connected in the mounting area 120. At least the rear surface heat dissipation layer 60 is provided in the bent portion 130.

Therefore, it is possible to enlarge the area of the rear surface heat dissipation layer 60, thereby further improving the heat dissipation performance. It is also possible to improve the incorporation into the lamp house or the like due to the presence of the bent portion 130. Further, it also possible to improve rigidity of the flexible printed board 10S due to the presence of the bent portion 130.

In the above-described embodiment, the single flexible printed board 10 is described, however, the present invention is not limited to such a structure. For example, the rear surface heat dissipation layers 60 of the single flexible printed board 10 may be bonded to each other. In this case, for example, the flexible printed board 10 may be folded back so that the rear surface heat dissipation layers 60 are bonded to each other.

Further, in the above-described embodiment, a case where the LED 100 is used as the load is described. However, the load is not limited to the LED 100. For example, it is possible to use various loads such as a circuit using a thermoelectric element, a control circuit, a memory device, a minute driving device, a heating circuit using a heating wire, and the like.

DESCRIPTION OF REFERENCE SIGNS 10, 10A, 10B, 10S: flexible printed board, 20: thermally conductive resin layer, 30, 30A, 30B: copper foil layer (front surface heat dissipation layer), 31: circuit portion, 32: wiring portion, 40, 40A, 40B: adhesive material layer, 50, 50A: cover material layer, 60: rear surface heat dissipation layer, 61: slit portion (corresponding to recess), 62: cable side rear surface heat dissipation layer, 63: circuit side rear surface heat dissipation layer, 70: cover coat layer, 80, 80A, 80B: white coating layer, 100: LED, 110: cable portion, 120: mounting area, 130: bent portion, 200A, 200B: polyimide layer, 210A, 210B: adhesive material layer, 220A: reinforcing-plate adhesive material layer, 230A: aluminum heat dissipating material, 231A: leg portion, 250B: copper foil layer, 260B: adhesive material layer, 270B: polyimide layer, 300: polystyrene foam, P1: thermal diffusion path, R1: overlap region.

The invention claimed is:

1. A flexible printed board on which a power consuming load is mounted, comprising:
a front surface heat dissipation layer made of a copper foil and having a circuit portion on which the load is mounted;
a thermally conductive resin layer having the front surface heat dissipation layer laminated to a front surface side thereof and having a thermal conductivity of 0.49 W/mK or more, the front surface heat dissipation layer being arranged between the power consuming load and the thermally conductive resin layer with respect to a thickness direction, the front surface heat dissipation layer being directly contact with a front surface side of the thermally conductive resin layer; and
a rear surface heat dissipation layer made of a copper foil, laminated to and in direct contact with a rear surface side of the thermally conductive resin layer, and having a thickness of 100 to 400% with respect to the front surface heat dissipation layer.

2. The flexible printed board according to claim 1, wherein
the thermally conductive resin layer contains an epoxy resin, a curing agent, a curing accelerator, a flexibility component, and a thermally conductive filler, and
a blending amount of the thermally conductive filler in the thermally conductive resin layer is 30 vol % or more.

3. The flexible printed board according to claim 2, wherein the thermally conductive filler contains one or more components selected from zinc oxide, titanium oxide, boron nitride, aluminum oxide, aluminum nitride, silicon carbide, hexagonal boron nitride and magnesium carbonate.

4. The flexible printed board according to claim 2, wherein
the rear surface heat dissipation layer is further provided with a cover coat layer on a rear surface side thereof, and
the cover coat layer in a portion in which the rear surface heat dissipation layer is etched has a film thickness of 15 μm or less and a thermal emissivity of 0.68 or more.

5. The flexible printed board according to claim 4, wherein the rear surface heat dissipation layer is further provided with an etched recess.

6. The flexible printed board according to claim 5, wherein an elongation percentage of a portion having the cover coat layer laminated to the thermally conductive resin layer in a portion from which the front surface heat dissipation layer is removed on a front surface side of the recess is 19.5% or more.

7. The flexible printed board according to claim 5, wherein
the front surface heat dissipation layer is further provided with a wiring portion connected to the circuit portion, and
a slit portion corresponding to the recess partially etched for bending or curving is provided on a rear surface side of the wiring portion.

8. The flexible printed board according to claim 7, further comprising:
a mounting area including the circuit portion on which the load is mounted; and
a cable portion including the wiring portion and located between mounting areas adjacent to each other and connecting the mounting areas, wherein
the recess is formed on an end portion side of the rear surface heat dissipation layer in the cable portion so as to overlap an end portion side of the front surface heat dissipation layer in a plan view.

9. The flexible printed board according to claim 7, further comprising:
a mounting area including the circuit portion on which the load is mounted; and a cable portion including the wiring portion and located between mounting areas adjacent to each other and connecting the mounting areas, wherein
a bent portion bent in the thickness direction is connected to an end portion side in a width direction intersecting a longitudinal direction of a portion to which the cable portion is connected in the mounting area, and at least the rear surface heat dissipation layer is provided in the bent portion.

10. The flexible printed board according to claim 1, wherein the rear surface heat dissipation layer is a first surface heat dissipation layer, the flexible printed circuit board further comprising a second rear surface heat dissipation layer, wherein the first and the second rear surface heat dissipation layers are bonded to each other.

11. A method for manufacturing a flexible printed board on which a power consuming load is mounted, comprising:

a first step of forming an uncured thermally conductive resin layer which is a thermally conductive resin layer having a thermal conductivity of 0.49 W/mK or more in a cured state on a copper foil as a front surface heat dissipation layer;

a second step of bonding another copper foil having a thickness of 100 to 400% with respect to the front surface heat dissipation layer to the uncured thermally conductive resin layer, as a rear surface heat dissipation layer after the first step; and a third step of etching the copper foil to be the front surface heat dissipation layer and the other copper foil to be the rear surface heat dissipation layer to form the front surface heat dissipation layer and the rear surface heat dissipation layer.

12. The flexible printed board according to claim 7, wherein the rear surface heat dissipation layer is a first surface heat dissipation layer, the flexible printed circuit board further comprising a second rear surface heat dissipation layer, and wherein the first and the second rear surface heat dissipation layers are bonded to each other, the first rear surface heat dissipation layer being a circuit side rear surface heat dissipation layer opposed to the circuit portion via the thermally conductive resin layer, and the second rear surface heat dissipation layer being a cable side rear surface heat dissipation layer opposed to the wiring portion via the thermally conductive resin layer.

* * * * *